(12) United States Patent
Zhou

(10) Patent No.: US 10,692,779 B2
(45) Date of Patent: Jun. 23, 2020

(54) METHOD AND STRUCTURE FOR CMOS METAL GATE STACK

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 16/383,531

(22) Filed: Apr. 12, 2019

(65) Prior Publication Data
US 2019/0244868 A1    Aug. 8, 2019

Related U.S. Application Data

(62) Division of application No. 15/283,113, filed on Sep. 30, 2016, now Pat. No. 10,304,745.

(30) Foreign Application Priority Data

Oct. 19, 2015   (CN) .......................... 2015 1 0676869

(51) Int. Cl.
*H01L 21/8238* (2006.01)
*H01L 21/285* (2006.01)
(Continued)

(52) U.S. Cl.
CPC .............. *H01L 21/823842* (2013.01); *H01L 21/28518* (2013.01); *H01L 21/28556* (2013.01);
(Continued)

(58) Field of Classification Search
None
See application file for complete search history.

(56) References Cited

U.S. PATENT DOCUMENTS 9,012,319 B1  4/2015  Choi et al.
10,304,745 B2  5/2019  Zhou
(Continued)

FOREIGN PATENT DOCUMENTS

CN        103077947       5/2013

OTHER PUBLICATIONS

U.S. Appl. No. 15/283,113, Final Office Action, dated Feb. 14, 2018, 22 pages.
(Continued)

*Primary Examiner* — Jay C Chang
(74) *Attorney, Agent, or Firm* — Kilpatrick Townsend & Stockton LLP

(57) ABSTRACT

A method for forming a semiconductor device includes providing a substrate, the substrate including a first trench in an NMOS region and a second trench in a PMOS region. The method also includes depositing a high-K dielectric layer, a cap layer, and a P-type work function metal layer on the bottom and side walls of the first trench and the second trench, removing the P-type work function metal layer and the cap layer from the bottom and sidewalls of the first trench, depositing an N-type work function metal layer on the high-K dielectric layer in the first trench and on the
(Continued)

P-type work function metal layer in the second trench, and depositing a metal electrode layer on the N-type work function metal layer.

8 Claims, 4 Drawing Sheets

(51) Int. Cl.
    *H01L 27/092*     (2006.01)
    *H01L 29/49*     (2006.01)

(52) U.S. Cl.
    CPC .... *H01L 21/823821* (2013.01); *H01L 27/092* (2013.01); *H01L 27/0924* (2013.01); *H01L 29/4966* (2013.01)

(56) References Cited

U.S. PATENT DOCUMENTS

| | | |
|---|---|---|
| 2010/0068877 A1 | 3/2010 | Yeh et al. |
| 2013/0071975 A1 | 3/2013 | Kitano et al. |
| 2013/0075827 A1* | 3/2013 | Lee ............... H01L 29/4966 |
| | | 257/369 |
| 2013/0299914 A1 | 11/2013 | Kim |
| 2013/0299918 A1* | 11/2013 | Kim ................ H01L 29/78 |
| | | 257/402 |
| 2014/0145274 A1 | 5/2014 | Laloe et al. |
| 2015/0035073 A1 | 2/2015 | Ando et al. |
| 2015/0279680 A1 | 10/2015 | Kashefi et al. |
| 2017/0117191 A1 | 4/2017 | Zhou |

OTHER PUBLICATIONS

U.S. Appl. No. 15/283,113, Non-Final Office Action, dated Sep. 7, 2018, 11 pages.
U.S. Appl. No. 15/283,113, Non-Final Office Action, dated Sep. 8, 2017, 15 pages.
U.S. Appl. No. 15/283,113, Notice of Allowance, dated Jan. 9, 2019, 8 pages.
U.S. Appl. No. 15/283,113, Restriction Requirement, dated Jul. 20, 2017, 7 pages.
China Patent Application No. CN201510676869.2, Office Action, dated Oct. 29, 2018, 6 pages.
European Patent Application No. 16193001.1, Extended European Search Report, dated Feb. 16, 2017, 8 pages.

* cited by examiner

METHOD AND STRUCTURE FOR CMOS METAL GATE STACK

CROSS-REFERENCES TO RELATED APPLICATIONS

This application is a divisional of U.S. patent application Ser. No. 15/283,113, filed on Sep. 30, 2016, which claims priority to Chinese Patent Application No. 201510676869.2, filed on Oct. 19, 2015, the contents of which are incorporated herein by reference in their entirety.

BACKGROUND OF THE INVENTION

The present invention relates to the field of semiconductor technology. Some embodiments of the invention are directed to device structures and manufacturing methods for making metal gate stacks for CMOS devices.

As critical dimensions shrink in metal oxide semiconductor field effect transistors (Metal Oxide Semiconductor Field Effect Transistor, MOSFET), short channel effect (SCE) has become a critical issue. FinFET (Fin Field Effect Transistor) has a good gate control capability to effectively suppress the short channel effect. Furthermore, the FinFET device can reduce random dopant fluctuation (RDF) and improve the stability of the device. Therefore, the design of a small-sized semiconductor element often employs a FinFET device.

The gate work function plays an important role in the threshold voltage of FinFET devices. In the 14 nm HKMG (high-k+metal gate) FinFET device of the process, a low temperature process (for example, 100° C.) is often used to deposit an N-type work function metal layer. However, at low temperature, byproducts generated during deposition of the N-type work function metal layer are difficult to remove, and would impact a high-K dielectric layer, thereby affecting the device performance. Thus, high-temperature processes (for example 400° C.) have been proposed for the deposition of an N-type work function metal layer. However, the inventor discovered that, in conventional devices, the work function of an N-type work function metal layer tends to be too high, leading to the threshold voltage NMOS device being abnormally high.

BRIEF SUMMARY OF THE INVENTION

The inventors have identified drawbacks in the conventional methods for forming the N-type work function metal layer, such as having a high threshold voltage. Embodiments of the present invention provide a method and a structure for CMOS gate stacks. The method can apply to planar devices as well as FinFET devices.

According to some embodiments of the present invention, a method for forming a semiconductor device includes providing a substrate, the substrate including a first trench in an NMOS region and a second trench in a PMOS region. The method also includes depositing a high-K dielectric layer, a cap layer, and a P-type work function metal layer on the bottom and side walls of the first trench and the second trench, removing the P-type work function metal layer and the cap layer from the bottom and sidewalls of the first trench, depositing an N-type work function metal layer on the high-K dielectric layer in the first trench and on the P-type work function metal layer in the second trench, and depositing a metal electrode layer on the N-type work function metal layer.

In an embodiment, the substrate also has a first fin structure in the first trench and a second fin structure in the second trench, and the high-K dielectric layer, the cap layer, and the P-type work function metal are deposited on the top surface and side walls of the first fin and the second fin.

In an embodiment, the cap layer on the high-K dielectric includes TiN (titanium nitride) and TaN (tantalum nitride), or TiSiN (titanium silicon nitride) and TaN (tantalum nitride), and the N-type work function metal layer comprises one or more of TiAl (Titanium aluminide), TiCAl (titanium carbon aluminide), TiNAl (titanium nitrogen aluminide) or TiSiA (titanium silicon aluminide). TiAl (titanium aluminide) is an intermetallic chemical compound. It is lightweight and resistant to oxidation and heat. TiCAl (titanium carbon aluminide), TiNAl (titanium nitrogen aluminide) or TiSiA (titanium silicon aluminide) are intermetallic chemical compounds of Ti and Al with additional components of C (carbon), N (nitrogen), and Si (silicon), respectively.

In an embodiment, depositing the N-type work function metal layer includes depositing a first N-type work function metal layer having a Ti (titanium) content greater than the Al (aluminum) content, and depositing on the first N-type work function metal layer a second N-type work function metal layer having an Al content greater than the Ti content.

In an embodiment, the thickness ratio of the first N-type work function metal layer and the second N-type work function metal layer is 1:2.

In an embodiment, the thickness of the first N-type work function metal layer is 10-15 Å; and the thickness of the second N-type work function metal layer is 35-40 Å.

In an embodiment, the method also includes, before depositing the high-K dielectric layer, forming an interface layer on the bottom and sidewalls of the first trench and the second trench.

In an embodiment, the method also includes, prior to the deposition of the N-type work function metal layer, removing the P-type work function metal layer on top of the sidewalls of the second trench using an etch back process.

In an embodiment, the method also includes, prior to deposition of the metal electrode layer, depositing an adhesive layer on the N-type work function metal layer.

In an embodiment, the method also includes planarizing the metal electrode layer.

According to some embodiments of the present disclosure, a semiconductor apparatus includes an NMOS device. The NMOS device includes a substrate, and a gate structure overlying the substrate. The gate structure includes a metal gate, an N-type work function metal layer on the bottom and sides of the metal gate, and a high K dielectric layer on the bottom and sides of the N-type work function metal layer.

In an embodiment, the apparatus also includes a first fin structure on the substrate, and the gate structure overlies the fin structure.

In an embodiment, the N-type work function metal layer comprises one or more of TiAl, TiCAl, TiNAl, or TiSiAl.

In an embodiment, the N-type work function metal layer includes a first N-type work function metal layer having Ti and Al, in which the Ti content is greater than the Al content, and a second N-type work function metal layer having Ti and Al, in which the Al content is greater than the Ti content.

In an embodiment, the thickness ratio between the first N-type work function metal layer and the second N-type work function metal layer is 1:2.

In an embodiment, the thickness of the first N-type work function metal layer is 10-15 angstroms, and the thickness of the second N-type work function metal layer is 35-40 angstroms.

In an embodiment, the apparatus also includes an interface layer between the substrate the said high-K dielectric layer.

In an embodiment, the apparatus also includes an adhesion layer between the metal gate and the N-type work function metal layer.

In an embodiment, the apparatus also includes a PMOS device. The PMOS device includes a substrate and a gate structure on the substrate. The gate structure has a metal gate, a PMOS work function metal layer on the bottom and sides of the metal gate, a cap layer on the bottom and sides of the PMOS work function metal layer, and a high K dielectric layer on the bottom and sides of the cap.

In an embodiment, the metal gate comprises an upper portion and a lower portion, the upper portion being wider than the lower portion along the direction of a channel of the PMOS device.

In an embodiment, the cap layer comprises TiN and TaN or TiSiN and TaN on the high-K dielectric layer.

In an embodiment, the PMOS device also has an interface layer between the substrate and the high-K dielectric layer is the interface layer.

In an embodiment, the PMOS device also has an adhesive layer between the metal gate and the P-type work function metal layer.

In an embodiment, the PMOS device also has an N-type work function metal layer between the metal gate and the P-type work function metal layer.

According to some embodiments of the invention, a semiconductor apparatus includes a substrate, which includes a first trench in an NMOS region and a second trench in a PMOS region. The semiconductor apparatus also includes a high-K dielectric layer on the bottom and side walls of the first trench and the second trench. The semiconductor apparatus also has a cap layer on the high-K dielectric layer in the second trench, and a P-type work function metal layer on the cap layer in the second trench. The semiconductor apparatus also has an N-type work function metal layer on the high-K dielectric layer in the first trench. The N-type work function metal layer overlies at least a portion of the P-type work function metal layer in the second trench. In some embodiments, a metal electrode layer is disposed on the N-type work function metal layer in the first trench and the second trench.

In an embodiment of the above semiconductor apparatus, the metal gate includes an upper portion and a lower portion. The upper portion is wider than the lower portion along the direction of a channel of the PMOS device.

In an embodiment of the above semiconductor apparatus, the N-type work function metal layer includes a first N-type work function metal layer having Ti and Al, in which the Ti content is greater than the Al content, and a second N-type work function metal layer having Ti and Al, in which the Al content is greater than the Til content.

The following description, together with the accompanying drawings, will provide further understanding of the nature and advantages of the claimed invention.

DETAILED DESCRIPTION OF THE INVENTION

Figure 1:
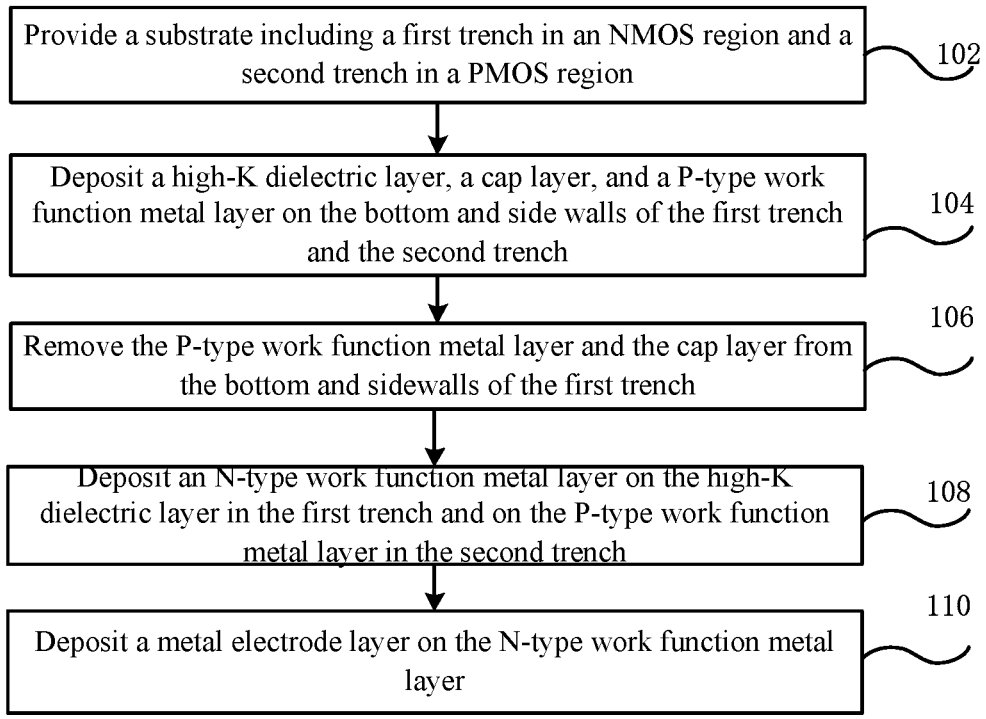
FIG. 1 is a simplified flow chart of a method for manufacturing a semiconductor device according to an embodiment of the present disclosure.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the size of the various components shown in the drawings are not necessarily drawn in actual proportional relationship. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

The inventor discovered that, under normal circumstances, after removing the dummy gate metal gate stack structure, the cap layer often has a relatively large work function. For example, the work function of the cap layer can be close to the P-type work function material layer. The presence of the cap layer can affect the threshold voltage of an NMOS device. Accordingly, the present invention provides a novel manufacturing method and the structure of the gate stack to lower the threshold voltage of an NMOS device.

FIG. 1 is a simplified flow chart of a method of manufacturing a semiconductor device according to an embodiment of the present disclosure. The method in FIG. 1 includes the following steps.

Step 102: providing a substrate, which includes a first trench formed in an NMOS region and a second trench in a PMOS region. In an example, the substrate may represent a CMOS device structure after the dummy gates and dummy gate oxide layers have been removed from an NMOS device and a PMOS device, leaving the first trench in the NMOS region and the second trench in the PMOS region. Further, the NMOS region and the PMOS region may be separated by an isolation structure, such as shallow trench isolation (STI) structure.

Step 104: sequentially depositing a high-K dielectric layer, a cap layer, and a P-type work function metal layer on the bottom and sidewalls of the first trench and the second trench.

Step 106: removing the P-type work function metal layer and the cap layer from the bottom and sidewalls of the first trench. Removing the cap layer in the NMOS region can reduce the effective work function of the NMOS device, and thus help to reduce the threshold voltage of the NMOS device.

Step 108: depositing an N-type work function metal layer on the high-K dielectric layer in the first trench and the P-type work function metal layer in the second trench.

Step 110: depositing a metal electrode layer on the N-type work function metal layer.

In this embodiment, the gate stack structure is formed in the NMOS device with the cap layer removed in the NMOS region. Since the work function of the cap is high and close to the work function of the P-type work function metal layer, removing the cap layer from the NMOS region can reduce the effective work function of the NMOS device, thereby lowering the threshold voltage of the NMOS device.

In the embodiments described above, the substrate may represent a CMOS device structure after the dummy gates and dummy gate oxide layers have been removed from an NMOS device and a PMOS device, leaving the first trench in the NMOS region and the second trench in the PMOs region. In embodiments of the invention, the method of manufacturing a semiconductor device is suitable for a planar device, as well as for other device structures, such as FinFET devices. In a FinFET CMOS device, a first fin can form a channel region of the NMOS device, and a second fin can form a channel region of the PMOS device. A gate stack would be formed on the top surface and the sidewalls of each fin. In this case, the fin would be disposed inside the trench, which forms a template for the gate stack surrounding the fin. As shown in FIG. 1, step 104 may include: on the top surfaces and side walls of the first fin and the second fin sequentially depositing a high-K dielectric layer, a cap layer, and a P-type work function metal layer. In this case, the first trench may represent a sidewall of the first fin, and the second trench may represent a sidewall of the second fin. Subsequent processes for the FinFET device are similar to those depicted in FIGS. 2-8 for the planar device.

FIG. 2-FIG. 8 illustrate cross-sectional views of the various stages of the manufacturing method according to embodiments of the invention. It is be noted that, in order to simplify the drawings and more clearly illustrate the structure of the gate stack, certain components, such as the source region, the drain region, the fins and the like are omitted in FIGS. 2-8.

Figure 2:
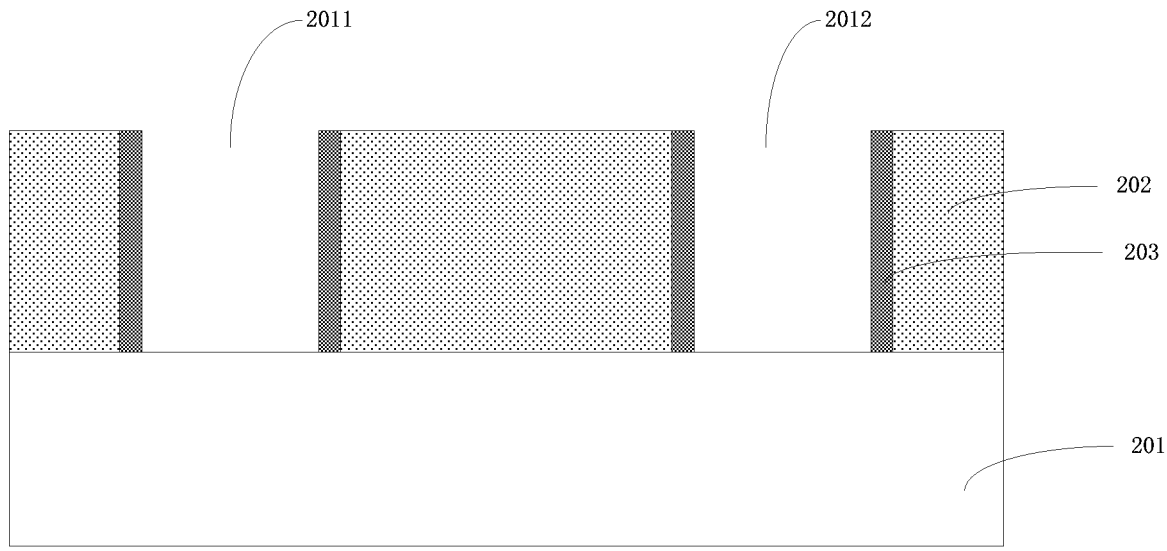
FIG. 2 shows a cross-sectional view of one stage of the method of manufacturing a semiconductor device according to an embodiment of the present disclosure.

As shown in FIG. 2, a substrate 201 includes a first trench 2011 formed in an NMOS region and a second trench 2012 in a PMOS region. In some embodiments, substrate 201 may be a silicon substrate, a silicon on insulator (SOI) substrate, a III-V semiconductor material the substrate, and the like. Substrate 201 may be formed with isolation structures, such as shallow trench isolation (STI) structures to isolate the devices.

The first trench 2011 and the second trench 2012 can be formed in the following way. After a dielectric layer 202 is deposited, it is planarized to expose the dummy gates in the first trench 2011 and the second trench 2012. Next, the dummy gates and dummy gate oxide layers are removed to form the first trench 2011 and the second trench 2012. The spacers 203 are retained on the sidewalls of the two trenches. Spacers 203 may be formed with silicon oxide, silicon nitride, silicon oxynitride, and the like. In addition, NMOS and PMOS device source/drain regions may be formed in substrate 201 on both sides of the first trench 2011 and second trench 2012. In the NMOS region, the source region/drain region may be formed by epitaxial growth of SiC to introduce tensile stress in the channel region; in the PMOS region, the source region/drain region may be formed by epitaxial growth of SiGe to introduce compressive stress to the channel region.

Figure 3:
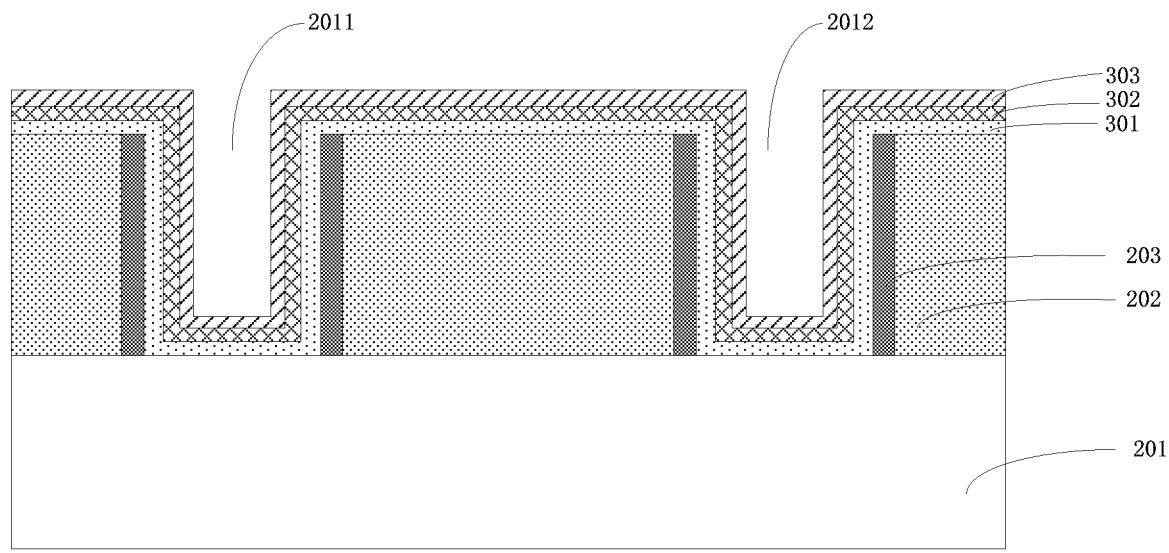
FIG. 3 shows a cross-sectional view of one stage of the method of manufacturing a semiconductor device according to an embodiment of the present disclosure.

As shown in FIG. 3, the method includes sequentially depositing a high-K dielectric layer 301, a cap layer 302, and a P-type work function metal layer 303 on the bottom and sidewalls in the first trench 2011 and the second trench 2012. Here, the sidewall spacers 203 are on the sidewalls of the trenches. In a planar device, the bottom of the trench would be the top surface of the substrate. In a FinFET device, the fin is inside the trench, and the bottom of the trench would include the top surface and sidewalls of the fin and the surface of the substrate. High-K dielectric layer 301, cap layer 302, and P-type work function metal layer 303 can be sequentially deposited by atomic layer deposition (ALD), chemical vapor deposition (CVD), or physical vapor deposition (PVD), etc. In some embodiments, before the deposition of high-K dielectric layer 301, an interface layer (not shown) can be formed on the bottom and sidewalls in the first trench 2011 and the second trench 2012. The interface layer, such as a thermal oxide layer, can improve the high-K interfacial properties between the dielectric layer and the substrate.

The material of high-K dielectric layer 301 can include, but is not limited to, hafnium oxide, aluminum oxide, tantalum oxide, titanium oxide, zirconium oxide, or other high-K materials. Cap layer 302 may include two layers, e.g., TiN layers and TaN located in turn on the high-K dielectric layer. Alternatively, cap layer 302 can include sequentially deposited TiSiN and TaN located on the high-K dielectric layer. Cap layer 302 can serve as an etch stop layer during the etching of the P-type work function metal layer. Cap layer 302 can also serve as a blocking layer to keep the aluminum (Al) in the N-type work function metal layer from diffusing into the high-K dielectric, which affects the stability and other properties of the device. The material for P-type work function metal layer 303 may include $Ti_xN_y$, (e.g., TiN), TaN, TaC, and other materials.

Figure 4:
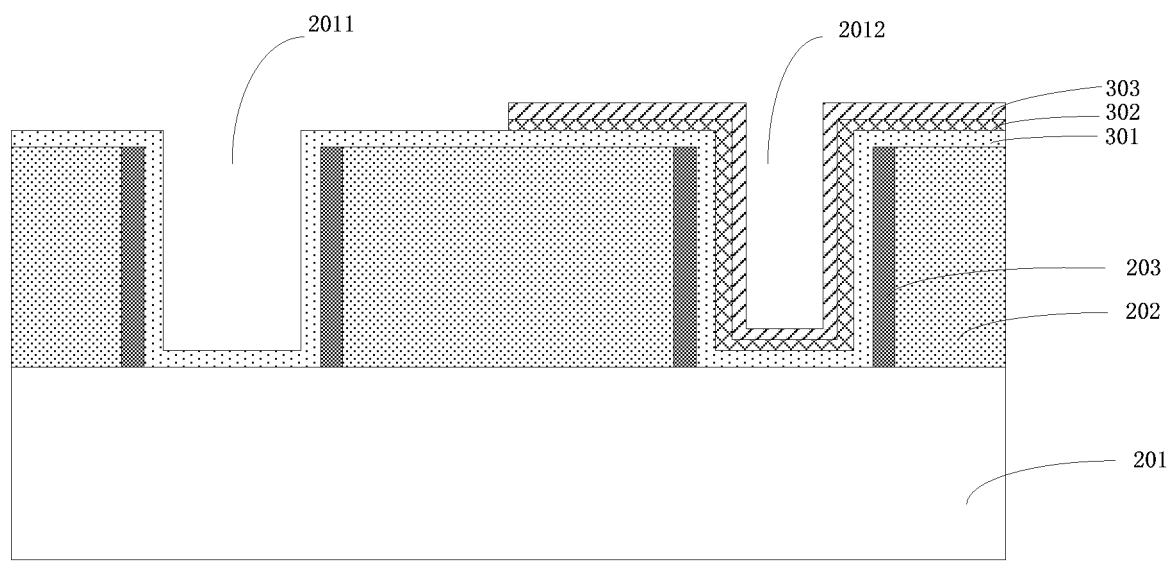
FIG. 4 shows a cross-sectional view of one stage of a method of manufacturing a semiconductor device according to an embodiment of the present disclosure.

As shown in FIG. 4, the P-type work function metal layer 303 and the cap layer 302 are removed from the bottom and sidewalls of the first trench 2011. This process can be carried out by forming a patterned photoresist layer covering the PMOS region and exposing the NMOS region. Then, a dry or wet etching process can be used to remove the P-type work function metal layer 303 and the cap layer 302 is removed from the bottom and sidewalls of the first trench 2011. As described above, removing cap layer 302 helps to reduce the threshold voltage of the NMOS device.

Figure 5:
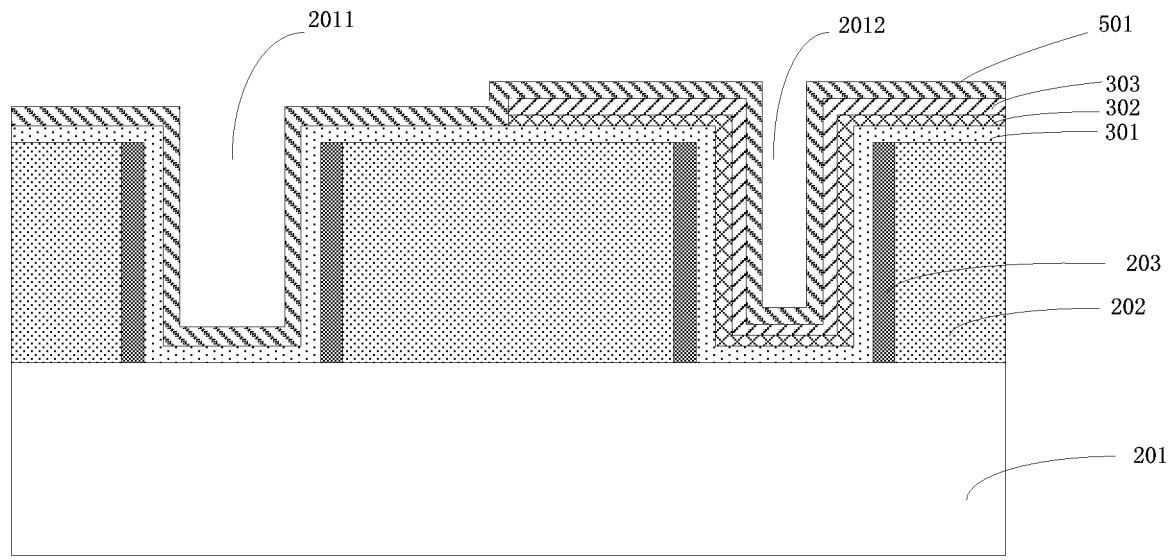
FIG. 5 shows a cross-sectional view of one stage of a method of manufacturing a semiconductor device according to an embodiment of the present disclosure.

As shown in FIG. 5, an N-type work function metal layer 501 is deposited on the high-K dielectric layer 301 in the first trench 2011 and on the P-type work function metal layer 303 in the second trench 2012. In an embodiment, the material for N-type work function metal layer 501 may include TiAl, TiCAl, TiNAl, or TiSiAl. In an embodiment, an ALD process is used to deposit a TiAl N-type work function metal layer. First, $TiCl_4$ is introduced in the reaction chamber, a layer of $TiCl_4$ is adsorbed on the surface of the P-type work function metal layer of the first trench. After excess $TiCl_4$ is removed, an Al precursor is introduced. Under a condition of a temperature of 80-200° C. and a pressure of 10-100 Torr, a layer of TiAl is formed. The excess Al precursor is then removed. This process is repeated until a desired thickness of TiAl.

Figure 6:
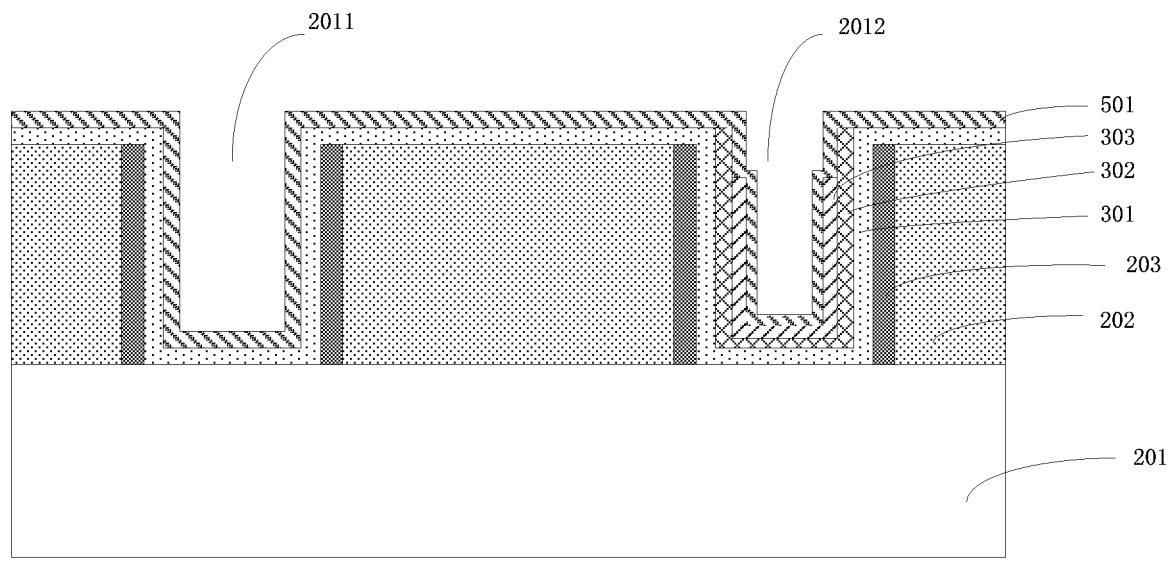
FIG. 6 shows a cross-sectional view of one stage of a method of manufacturing a semiconductor device according to an embodiment of the present disclosure.

In an alternative embodiment, as shown in FIG. 6, a portion of P-type work function metal layer 303 at the top of the sidewalls in the second trench 2012 may be first removed by an etch back process, and then N-type work function metal layer 501 is deposited. In this process, the opening of second trench opening 2012 can be increased, and it can improve the gap-filling in subsequent deposition of a metal electrode layer to avoid voids formation in the metal electrode.

Since the cap layer is removed in the NMOS region, the Al in the N-type work function metal layer can diffuse into the high-K dielectric layer, thus affecting the performance of the device. To solve this problem, in some embodiments, the process of depositing the N-type work function metal layer is divided into two steps. This process is described below using TiN as an example. First, depositing a first N-type work function metal layer in which the Ti content is greater than the Al content. In an example, a thickness of 10-15 angstroms of the first N-type work function metal layer is deposited. In the second step, a second N-type work function metal layer in which the content of Ti is greater than the content of Al content is deposited. In an example, a thickness of 35-40 angstroms of the second N-type work function metal layer is deposited. Here, the deposition of the first N-type work function metal layer and the deposition of the second step of the N-type work function metal layer can be performed in the same work station. Alternatively, these two steps can also be carried out in different machines. If these two processes are carried out in the same machine, it can reduce the waiting time between first and second steps (Q-time), so that an obvious interface in not formed between the first N-type work function metal layer and the second N-type work function metal layer, further improving the performance of the N-type work function metal layer. In some embodiments, the thickness ratio of the first N-type work function metal layer and the second N-type work function metal layer is 1:2. The ratio can be adjusted to reduce Al diffusion and adjust NMOS work function to further improve device performance. It is noted that the N-type work function metal layer in the PMOS region may also be removed by additional steps.

Figure 7:
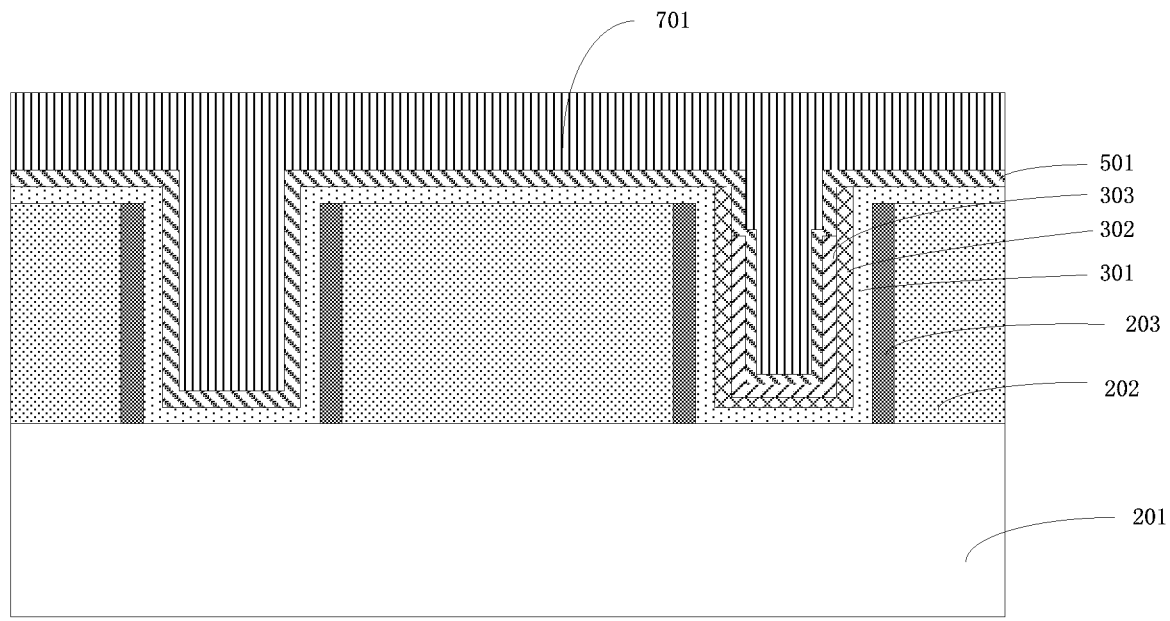
FIG. 7 shows a cross-sectional view of one stage of a method of manufacturing a semiconductor device according to an embodiment of the present disclosure.

As shown in FIG. 7, a metal electrode layer 701 is deposited on the N-type work function metal layer. The material of the metal electrode layer may be W or A, or other metallic materials. Alternatively, prior to deposition of the metal electrode layer 701, an adhesive layer (glue layer) may be deposited on the N-type work function metal layer, e.g., TiN, Ti, or a laminate structure of the two, so that the metal electrode layer and the N-type work function metal layer can be combined more closely.

Figure 8:
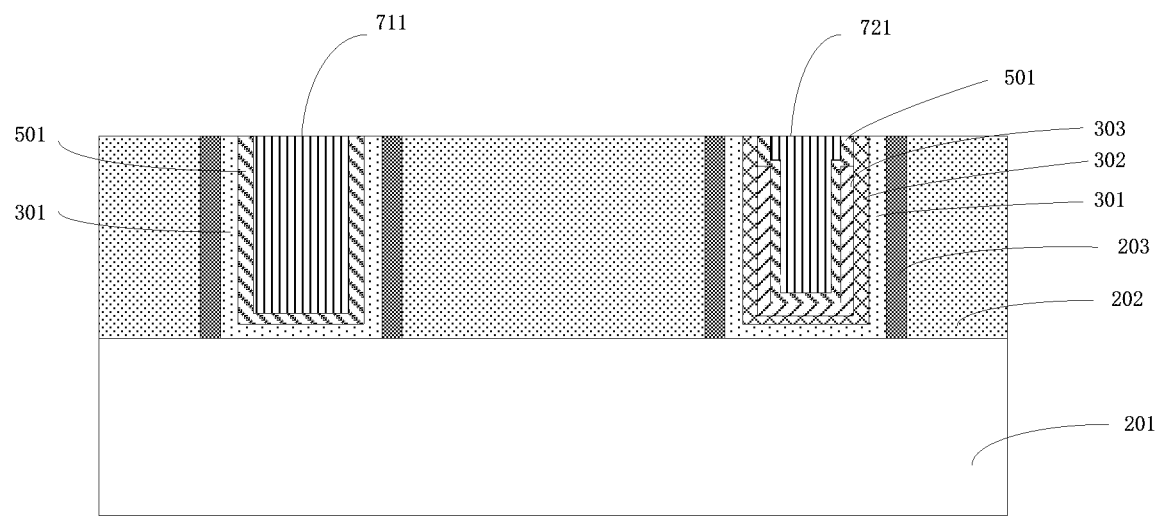
FIG. 8 shows a cross-sectional view of one stage of a method of manufacturing a semiconductor device according to an embodiment of the present disclosure.

Thereafter, as shown in FIG. 8, the metal electrode layer 701 may be planarized to expose the interlayer dielectric layer 202, thereby forming a metal gate 711 in the NMOS region and a metal gate electrode 712 in the PMOS region. Note that FIGS. 7 and 8 illustrate a cross-sectional view of depositing metal electrode layer 701 and planarizing it on the basis of FIG. 6. It is understood that the deposition and planarization of the metal electrode may also be carried out on the structure of FIG. 5.

Embodiments of the invention also provide a semiconductor device that can be formed using the method described above. For example, a semiconductor device can include an NMOS and a PMOS device. According to the embodiment of FIG. 7, the NMOS device includes a gate structure on the substrate 201. The gate structure includes a high-K dielectric layer 301 disposed on substrate 201 and spacers 203, an N-type work metal layer 501 on the high-K dielectric layer, and a metal gate electrode 711. Further, the NMOS device may further include source and drain electrodes (not shown) on both sides of the gate structure.

In embodiments of the invention, the gate stack structure of the device does not include a cap layer that includes a large work function. Removing the cap layer reduces the effective work function, thereby reducing the threshold voltage of the device. NMOS devices may be planar devices or FinFET devices. In a FinFET NMOS device, substrate 201 has a first fin structure as a channel region of the NMOS device, and the gate structure is disposed across the first fin structure.

In some embodiments, the NMOS device may further include an interface layer between the substrate 201 and the high-K dielectric layer 301. In other embodiments, an NMOS FinFET device for the device may also include a first fin between the high-K dielectric layer and the interface layer. In still other embodiments, the NMOS device may further include an adhesive layer between the metal gate 711 and N-type metal gate work function metal layer 501.

The N-type work function metal layer 501 may include TiAl, TiCAl, TiNAl or TiSiAl. In some embodiments, N-type work function metal layer 501 can include a first N-type work function metal layer and a second N-type work function metal layer. In the first N-type work function metal layer, the Ti content is greater than the Al content, and the thickness of the first N-type work function metal layer is about 10-15 Å. In the second N-type work function metal layer, the Al content is greater than the Ti content, and the thickness of the second N-type work function metal layer is about 35-40 angstroms. In an example, the thickness ratio of the thickness of the first N-type work function metal layer and the second N-type work function metal layer is 1:2.

According to an embodiment of the present disclosure, the PMOS device includes a substrate 201 and a gate structure on a substrate 201. The gate structure includes a metal gate 721, e.g., W, Al, etc. The gate structure also includes a PMOS work function metal layer 303 on the bottom surface and side surfaces of metal gate 721. PMOS work function metal layer 303 can include materials such as $Ti_xN_y$, TaN, TaC and other materials. A cap layer 302 is disposed on the bottom and sides of the PMOS work function metal layer 303. Cap layer 302 may include a TiN layer on the high-K dielectric layer 301, and a TaN layer on the TiN layer. Alternatively, Cap layer 302 may include a TiSiN layer on the high-K dielectric layer 301, and a TaN layer on the TiSiN layer. The gate structure also includes high-K dielectric layer 301 on the bottom surface and side surfaces of cap layer 302. Further, PMOS devices may further include a source and a drain on both sides of the gate structure (not shown).

According to another embodiment as shown in FIG. 8, metal gate 721 metal gate has an upper portion and a lower portion. The upper portion is wider than the lower portion along the direction of a channel of the PMOS device. The cap layer can include TiN and TaN or TiSiN and TaN on the high-K dielectric layer. The PMOS device can also include an interface layer between the substrate and the high-K dielectric layer. The PMOS device can also have an adhesive layer between the metal gate and the P-type work function metal layer.

Thus, a manufacturing method of the semiconductor device has been described in detail and according to an embodiment of the present disclosure. In order to maintain clarity of the disclosed concept, certain details known in the art are not described in detail. Those skilled in the art can understand how to implement technical solutions disclosed herein based on the above description.

Unless otherwise indicated, terms such as "first" and "second" are used to distinguish the elements described. Thus, these terms are not necessarily intended to represent the time of these elements or other order. In addition, terms such as "front," "after," "top," "bottom," "upper," and "lower" are used to describe the position in the illustrations and are not intended for describing permanent relative positions permanently.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. A method of manufacturing a semiconductor device, comprising:
    providing a substrate, the substrate including a first trench in an N-type Metal Oxide Semiconductor (NMOS) region and a second trench in a P-type Metal Oxide Semiconductor (PMOS) region;
    depositing a high-K dielectric layer, a cap layer, and a P-type work function metal layer on a bottom and side walls of the first trench and the second trench;
    removing the P-type work function metal layer and the cap layer from the bottom and sidewalls of the first trench;
    depositing an N-type work function metal layer on the high-K dielectric layer in the first trench and on the P-type work function metal layer in the second trench; and
    depositing a metal electrode layer on the N-type work function metal layer,
    wherein depositing the N-type work function metal layer comprises:
        depositing a first N-type work function metal layer having a first Ti (titanium) content and a first Al (aluminum) content, wherein the first Ti content is greater than the first Al (aluminum)-content; and
        depositing, on the first N-type work function metal layer, a second N-type work function metal layer having a second Al content and a second Ti content, wherein the second Al content is greater than the second Ti content.

2. The method of claim 1, wherein the substrate further comprises a first fin structure in the first trench and a second fin structure in the second trench, wherein the high-K dielectric layer, the cap layer, and the P-type work function metal layer are deposited on an upper surface and side walls of the first fin structure and the second fin structure.

3. The method of claim 1, wherein the cap layer on the high-K dielectric layer comprises TiN (titanium nitride) and TaN (tantalum nitride), or TiSiN (titanium silicon nitride) and TaN (tantalum nitride); and
    the N-type work function metal layer comprises one or more of TiAl (Titanium aluminide), TiCAl (titanium carbon aluminide), TiNAl (titanium nitrogen aluminide) or TiSiA (titanium silicon aluminide).

4. The method of claim 1, wherein a thickness ratio of the first N-type work function metal layer and the second N-type work function metal layer is 1:2.

5. The method of claim 1, wherein a thickness of the first N-type work function metal layer is 10-15 Å; and a thickness of the second N-type work function metal layer is 35-40 Å.

6. The method of claim 1, further comprising, before depositing the high-K dielectric layer, forming an interface layer on the bottom and sidewalls of the first trench and the second trench.

7. The method of claim 1, further comprising, prior to depositing the N-type work function metal layer, removing the P-type work function metal layer on top of the sidewalls of the second trench using an etch back process.

8. The method of claim 1, further comprising, prior to depositing the metal electrode layer, depositing an adhesive layer on the N-type work function metal layer.

* * * * *